(12) United States Patent
Okumura et al.

(10) Patent No.: US 7,575,987 B2
(45) Date of Patent: Aug. 18, 2009

(54) METHOD OF PLASMA DOPING

(75) Inventors: Tomohiro Okumura, Kadoma (JP); Ichiro Nakayama, Kadoma (JP); Bunji Mizuno, Ikoma (JP)

(73) Assignee: Panasonic Corporation, Osaka (JP)

( * ) Notice: Subject to any disclaimer, the term of this patent is extended or adjusted under 35 U.S.C. 154(b) by 110 days.

(21) Appl. No.: 11/585,938

(22) Filed: Oct. 25, 2006

(65) Prior Publication Data

US 2007/0037367 A1 Feb. 15, 2007

Related U.S. Application Data

(62) Division of application No. 10/615,851, filed on Jul. 10, 2003, now abandoned.

(30) Foreign Application Priority Data

Jul. 11, 2002 (JP) ............................. 2002-202483

(51) Int. Cl.
*H01L 21/26* (2006.01)
(52) U.S. Cl. ...................... 438/513; 438/510
(58) Field of Classification Search ................ 438/510, 438/513; 257/E21.147; 156/345.43
See application file for complete search history.

(56) References Cited

U.S. PATENT DOCUMENTS

| 4,393,333 | A | * | 7/1983 | Sakudo et al. ......... 315/111.81 |
| 4,912,065 | A | * | 3/1990 | Mizuno et al. ............... 438/301 |
| 5,891,349 | A | | 4/1999 | Tobe et al. |
| 6,043,607 | A | | 3/2000 | Roderick |
| 6,095,159 | A | | 8/2000 | Blalock et al. |
| 6,223,685 | B1 | | 5/2001 | Gupta et al. |
| 6,280,563 | B1 | * | 8/2001 | Baldwin et al. ......... 156/345.48 |
| 6,624,084 | B2 | * | 9/2003 | Maeda et al. ............... 438/732 |
| 2004/0045669 | A1 | | 3/2004 | Okumura et al. |

FOREIGN PATENT DOCUMENTS

| CN | 1154569 | 7/1997 |
| CN | 1437223 | 8/2003 |

* cited by examiner

*Primary Examiner*—Bradley K Smith
(74) *Attorney, Agent, or Firm*—Wenderoth, Lind & Ponack, L.L.P.

(57) ABSTRACT

A doping device is provided having a vacuum container defining a chamber therein. The container has a portion made of dielectric material and bears an impurity to be doped in a substrate provided in the chamber. Also provided is a plasma source for generating a plasma in the chamber by forming an electric field through the portion of the container, such that ion in the plasma impinges against the portion of the container, feeding the impurity out of the portion of the container into the chamber.

10 Claims, 13 Drawing Sheets

METHOD OF PLASMA DOPING

This application is a divisional of U.S. application Ser. No. 10/615,851, filed Jul. 10, 2003 now abandoned.

RELATED APPLICATION

The present application claims the benefit of patent application No. 2002-202483 filed in Japan on Jul. 11, 2002, the entire disclosure of which is incorporated herein by reference.

FIELD OF THE INVENTION

The present invention relates to an apparatus for doping an impurity ion into a substrate such as a semiconductor substrate by the use of a plasma doping, or plasma implantation technique.

BACKGROUND OF THE INVENTION

FIG. 11 shows a conventional plasma doping device generally indicated by reference numeral 200. The device 200 has a container 202 defining a vacuum chamber 204 therein and an electrode or table 206 provided within the chamber 204 for supporting a substrate 208. The container 202 is connected to both a gas supply 210 for supplying a doping gas such as $B_2H_6$ and a vacuum pump 212 for generating a vacuum in the chamber 204. Also provided to the container 202 are a microwave guide 214 which emits micro wave through a window 216 into the chamber and a magnetic device 218 for directing the micro wave toward the substrate 208. The window 216 is made of a dielectric material such as silica glass. Also, the table 206 is connected through a capacitor 220 to a high frequency power source 222 for controlling the voltage of the table 206 and thereby an amount of impurity to be doped in the substrate. In operation, the doping gas is supplied into the chamber 204 where it is ionized by the interaction between the micro wave and a DC magnetic field to form a microwave plasma, i.e., cyclotron resonance plasma 224. Then, the ionized boron is implanted in the surface of the substrate 208 with an aid of the power source 222. For example, the substrate 208 is then formed with a metal wiring layer on the doped surface. In addition, a thin oxidation layer is generated on the metal wiring layer. Finally, gate electrodes are formed on the surface by a conventional deposition technique such as CVD, which results in MOS transistors.

However, it has been understood that the doping gas such as $B_2H_6$ including boron which exhibits an electric activity when it is added to the substrate such as a silicon substrate is a toxic material. Also, according to the plasma doping, all the materials in the doping gas are doped in the substrate. For example, in a case of $B_2H_6$, although boron is the only effective material, not only boron ion but also hydrogen ion is doped in the substrate. Then, the doped hydrogen ion can result in a generation of a lattice defect in the substrate at the subsequent heat treatment such as an epitaxial growth process.

To overcome this problem, there has been proposed another doping device in JP 9-115851 (A), which is shown in FIG. 12. The doping device generally indicated by reference numeral 230 has a block 232 including an impurity and is provided within the chamber 204. The block 232 is supported by a fixed support 234 electrically connected through a capacitor 236 to a high frequency power source 238. With this arrangement, a gas such as argon fed from the gas supply 210 is ionized to form the plasma ion, which in turn impinges against the block to draw the impurity ion therefrom for its implantation into the substrate. This device certainly eliminates the drawbacks of the previous device in FIG. 11, however; it renders the device bulky due to the additional structures including support 234. Also, the impurity ion drawn from the block 232 is implanted unevenly in the substrate 208 due to the unsymmetrical arrangement of the block 232 and the substrate 208.

SUMMARY OF THE INVENTION

Therefore, an object of the present invention is to provide an improved apparatus for plasma doping, which is capable of doping an impurity into a substrate in an even manner.

According to an apparatus for plasma doping of the present invention, a vacuum container is provided defining a chamber therein. The container has a portion bearing an impurity to be doped in a substrate provided in the chamber. Also provided to the apparatus is a plasma generator for generating a plasma in the chamber by forming an electric field through the portion of the chamber, which causes ion in the plasma to impinge against the portion of the container to draw the impurity out of the portion of the container into the chamber.

DETAILED DESCRIPTION OF THE PREFERRED EMBODIMENTS

With reference to the drawings, various embodiments of a method and apparatus for plasma doping of the present invention will be described hereinafter.

Figure 1A:
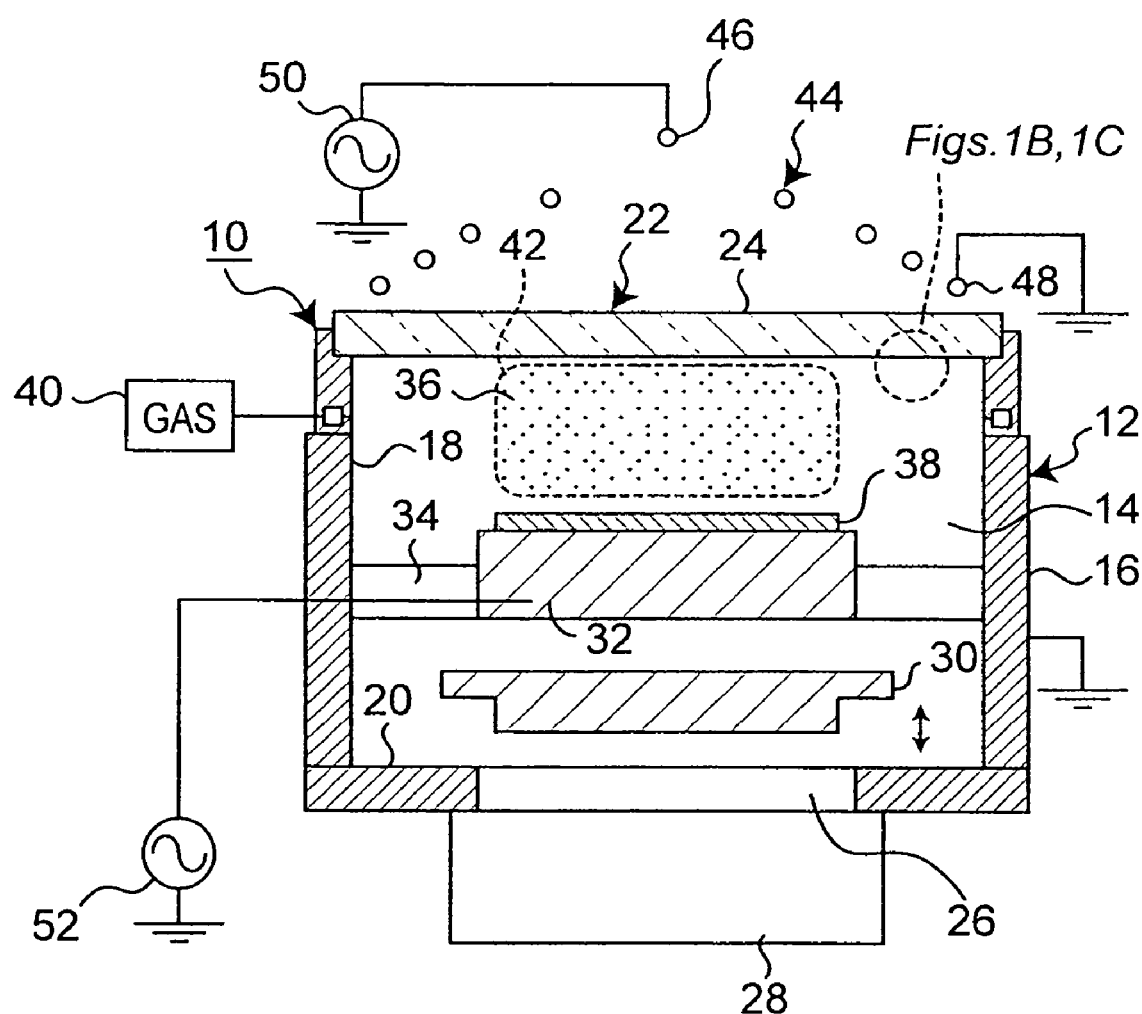
FIG. 1A is a schematic cross sectional view of a doping device according to the first embodiment of the present invention.

Referring to FIG. 1A, there is shown a plasma doping device, generally indicated by reference numeral 10, according to the present invention. The doping device 10 has a container 12 defining a chamber 14 therein. The container 12 has a first portion 16 defining side walls 18 and a bottom wall 20 of the container 12 and a second portion 22 defining a top wall 24 of the container 12 and removably attached to the first portion 16. The first portion 16 of the container 12 is made of an electrically conductive material such as aluminum and stainless steel and is electrically grounded to the earth. The second portion 22 of the container 12, i.e., top wall 24, is made of a dielectric material such as silicone, silica glass and silicon nitride, through which a high frequency electric field is induced in the chamber 14. The bottom wall 20 has an opening 26 defined therein and is fluidly connected to a vacuum pump 28 such as turbo-molecular pump. Provided in the chamber 14 and adjacent to the opening 26 is a valve member 30 which is supported by an elevating device not shown so that an open ratio of the opening 26 and thereby the vacuum in the chamber 12 is controlled to a certain value such as 0.04 Pa by elevating the valve member 30.

Figure 1B:
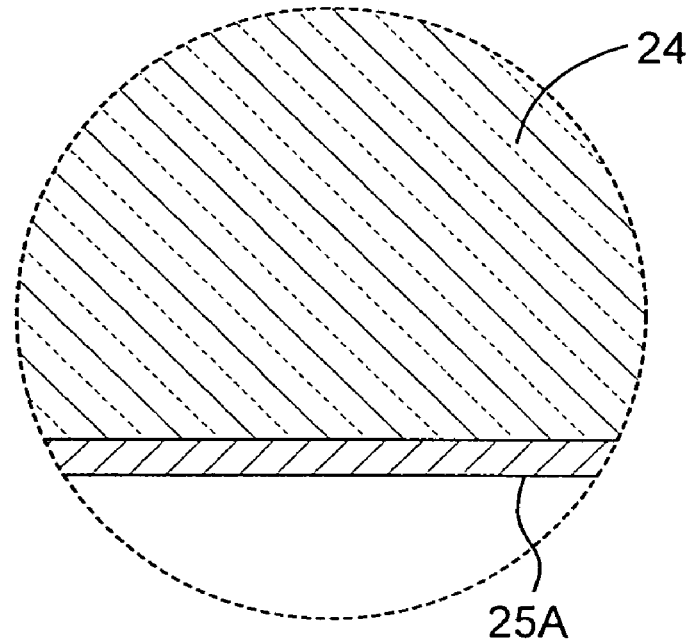
FIG. 1B is an enlarged cross sectional view of the top wall in FIG. 1A.
Figure 1C:
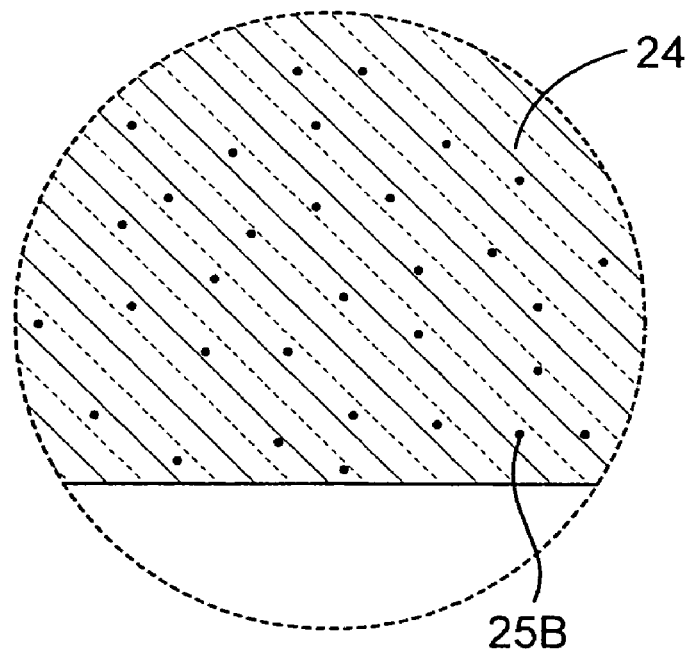
FIG. 1C is an enlarged cross sectional view of the top wall of another embodiment of the present invention.

In particular, as best shown in FIG. 1B, a lower surface portion of the top wall 24, defining in part the chamber 14, bears a layer 25A made of implantation impurity such as boron. Preferably, the boron layer has a thickness of about 10-100 μm. Advantageously, the lower limit is determined by considering the exchanging frequency and the upper limit is determined by considering the exfoliation of the layer. Alternatively, as shown in FIG. 1C the boron 25B may be incorporated in an interior of the top wall 24. In this instance, the boron is mixed in the manufacturing process of the wall 24. For example, if the top wall is made of silica glass, the powdery boron is uniformly added to the molten silica. If, on the other hand, the top wall is made of a ceramic material, the boron is mixed therewith before its sintering.

Also provided in the chamber 14 is a table 32. The table 32 is supported at the center of the chamber 14 by a plurality of supports 34 and spaced a certain distance away from the top dielectric wall 24 so that a certain volume of space 36 is defined for a plasma formation. Also, the table 32 has a top flat surface for supporting a substrate 38 such as silicon plate to which a predetermined ion is implanted.

A plasma gas supply source 40 is fluidly connected to the chamber 14 so that a certain gas including argon (Ar) is supplied therefrom into the chamber 14. For example, the amount of argon is controlled to 10 sccm (standard cubic centimeters per minute).

In order to produce a plasma 42, in particular Inductively Coupled Plasma (ICP) in the plasma formation space 36, a spiral coil 44 is arranged above the dielectric wall 24 and outside the chamber 14 in a coaxial fashion with the cylindrical container 12. As shown in the drawing, the central end portion 46 of the coil 44 is positioned higher than the opposite peripheral end portion 48 so that the coil 44 outlines a conical configuration. Also, the central end portion 46 of the coil 44 is connected to a first high frequency power source 50 capable of applying a high frequency electric power of 13.56 MHz, for example. On the other hand, the peripheral end portion 48 of the coil 44 is grounded to the earth.

Also, in order to provide a negative polarity to the table 32 and the substrate 38 relative to the plasma 42, a second high frequency power source 52 or power supply is electrically connected to the table 32.

In operation of the plasma doping device 10 so constructed, the substrate 38 is positioned on the table 32 so that the substrate 38 makes a substantially full surface contact with an opposing surface of the table 32. In this condition, the gas with Ar is supplied from the plasma gas supply source 40 into the chamber 14. Also, the chamber 14 is vacuumed by the pump 28 and the vacuum is controlled by the upward and/or downward movement of the valve member 30 and, as a result, by the adjustment of the opening ratio of the opening 26. Further, the temperature of the table is maintained at 10° C. Under this condition, the high frequency powers 800 W and 500 W are applied from the power sources 50 and 52 to the coil 44 and the table 32, respectively. As a result, the plasma 42 is generated above the substrate 38 in the space 36. This causes ion in the plasma to impinge on the top wall 24, which in turn results in the boron ion being emitted from the boron layer or the interior of the top wall into the chamber 14. The boron ion in the chamber 14 is then implanted into the surface of the substrate due to a sheath voltage generated between the plasma 42 and the substrate 38, causing an ultra thin boron implantation layer in the surface of the substrate 38.

In particular, since the spiral coil 44 is arranged in the conical fashion so that its central end portion 46 leaves more space from the top wall 24 than the peripheral end portion 48, this results in a substantially uniform high frequency electric field being applied to every portion of the boron layer 25A and the top wall 24, so that the boron ion is drawn therefrom and then implanted to the substrate in a substantially even manner.

Figure 2:
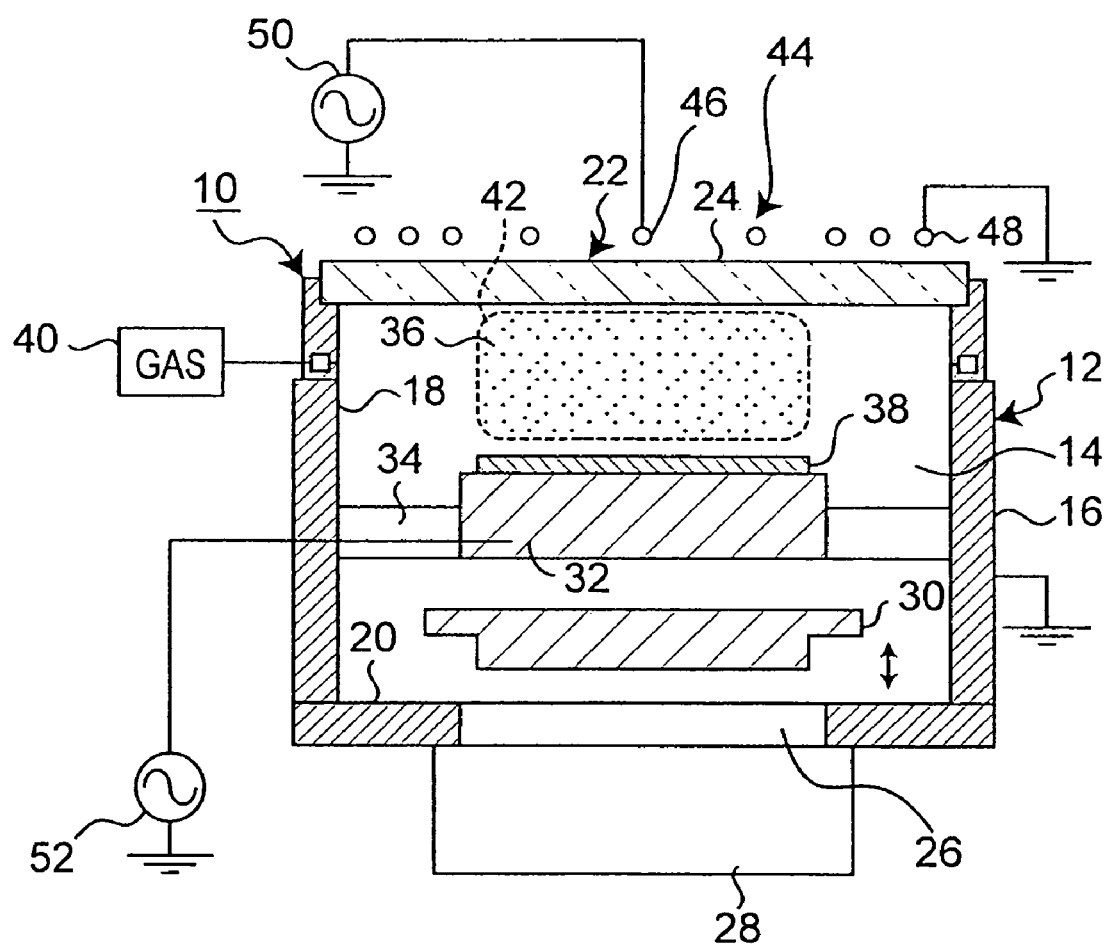
FIG. 2 is a schematic cross sectional view of another doping device of the present invention.

As shown in FIG. 2, the spiral coil 44 may be arranged parallel to the top wall 24 so that every portion of the coil 44 leaves a constant distance from the top wall 24. This improves the boron delivery from the central portion of the boron layer or the top wall. Therefore, in this instance, the peripheral portion of the top wall 24 may support more boron than the central portion thereof so that every portion of the top wall 24 supplies boron in a substantially even manner.

Figure 3:
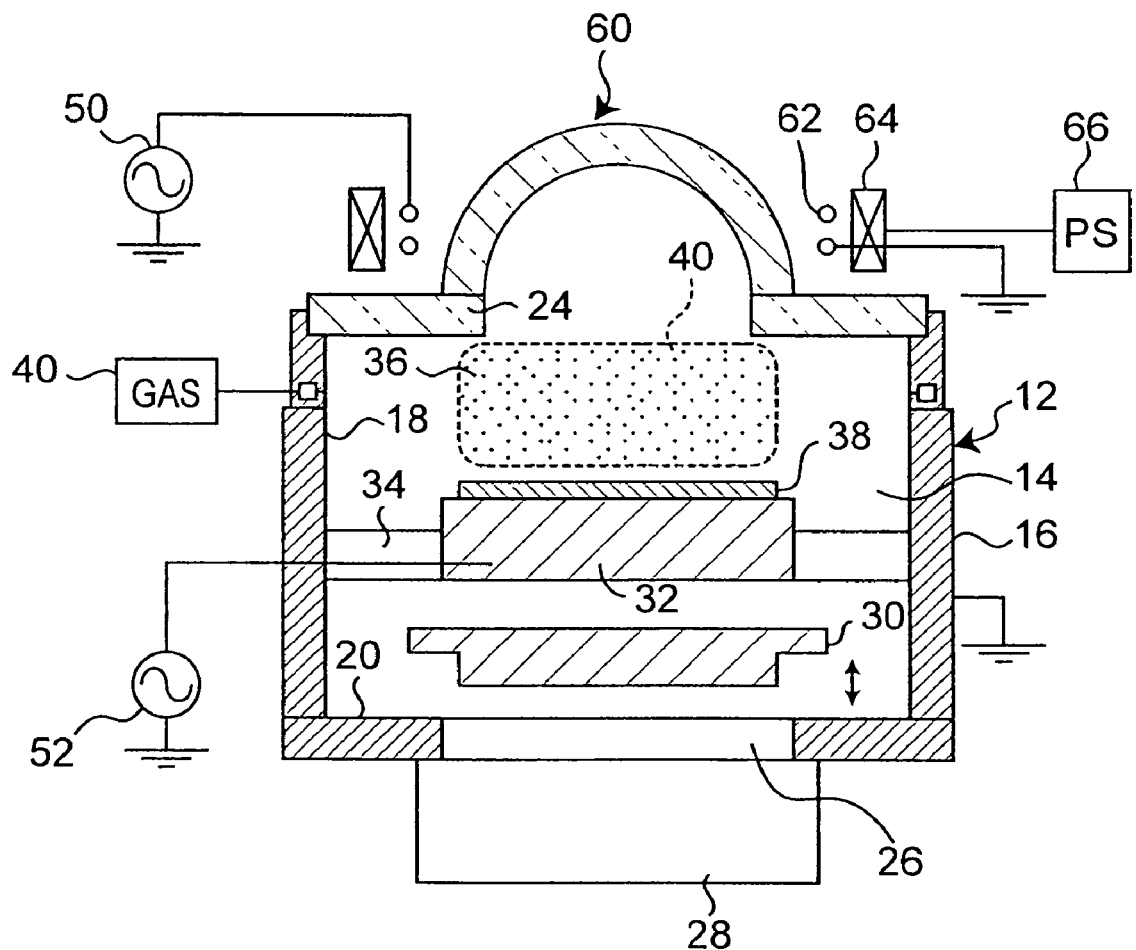
FIG. 3 is a schematic cross sectional view of another doping device of the present invention.

Referring to FIG. 3, the top wall 24 may have a semidome portion 60. In this embodiment, a coil 62 or antenna surrounds the semidome portion 60. Also, a magnetic coil 64, which is connected to a power source 66, is provided around the coil 62 to generate a magnetic field passing through the semidome portion 60 toward the substrate. This causes a helicon wave plasma or a magnetic neutral loop plasma, each having a higher density than the inductively coupled plasma. Also, a DC magnetic field or a low frequency magnetic field less than 1 kHz may be generated in the chamber 14 by controlling a current applied from the power source 66 to the magnetic coil 64.

Figure 4:
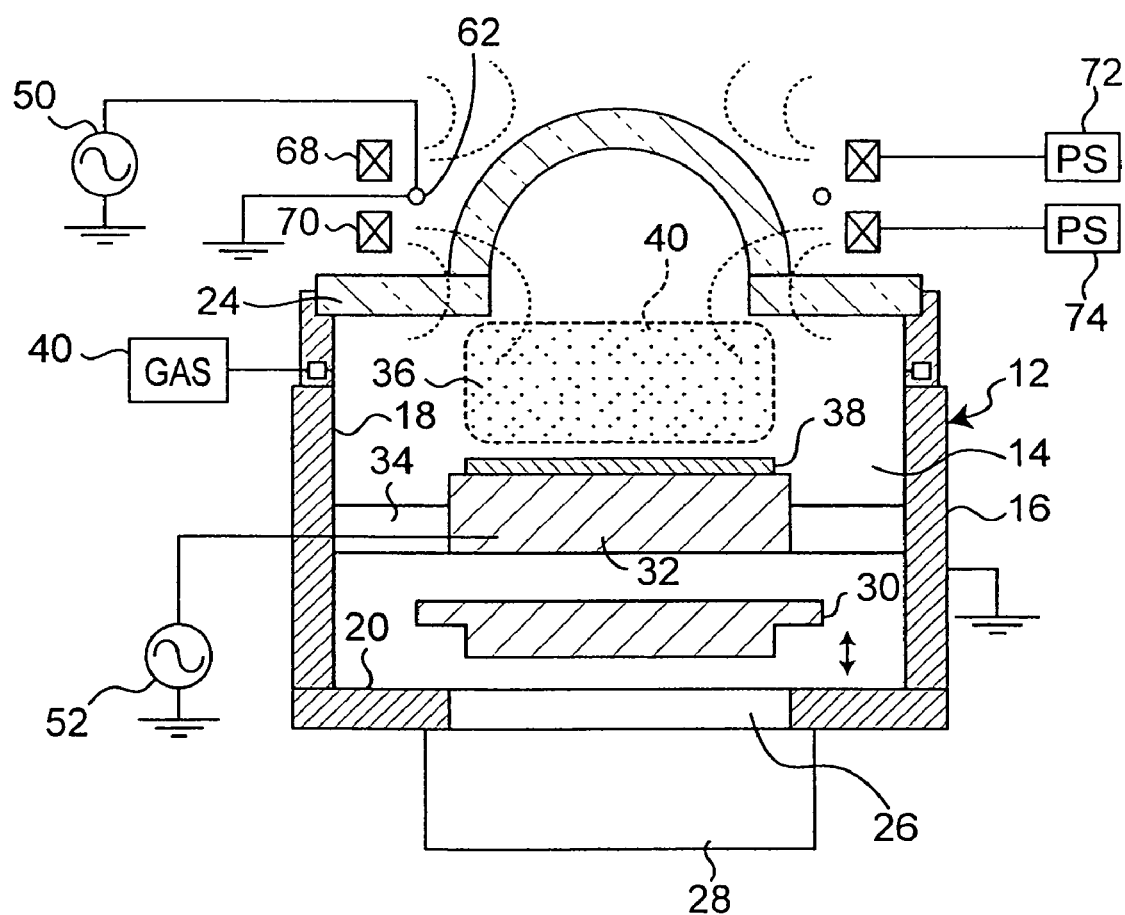
FIG. 4 is a schematic cross sectional view of another doping device of the present invention.

Referring to FIG. 4, two magnetic coils 68 and 70 may be provided around and symmetrically on opposite sides of the coil 62 and connected to respective power sources 72 and 74 capable of applying respective electric currents flowing in different directions so that repellant magnetic fields are generated on opposite sides of the coil 62, causing a magnetic neutral loop plasma having a higher density than the inductively coupled plasma. Also, a DC magnetic field or a low frequency magnetic field equal to or less than 1 kHz may be generated in the chamber 14 by controlling the current from the power sources to the magnetic coils.

Figure 5:
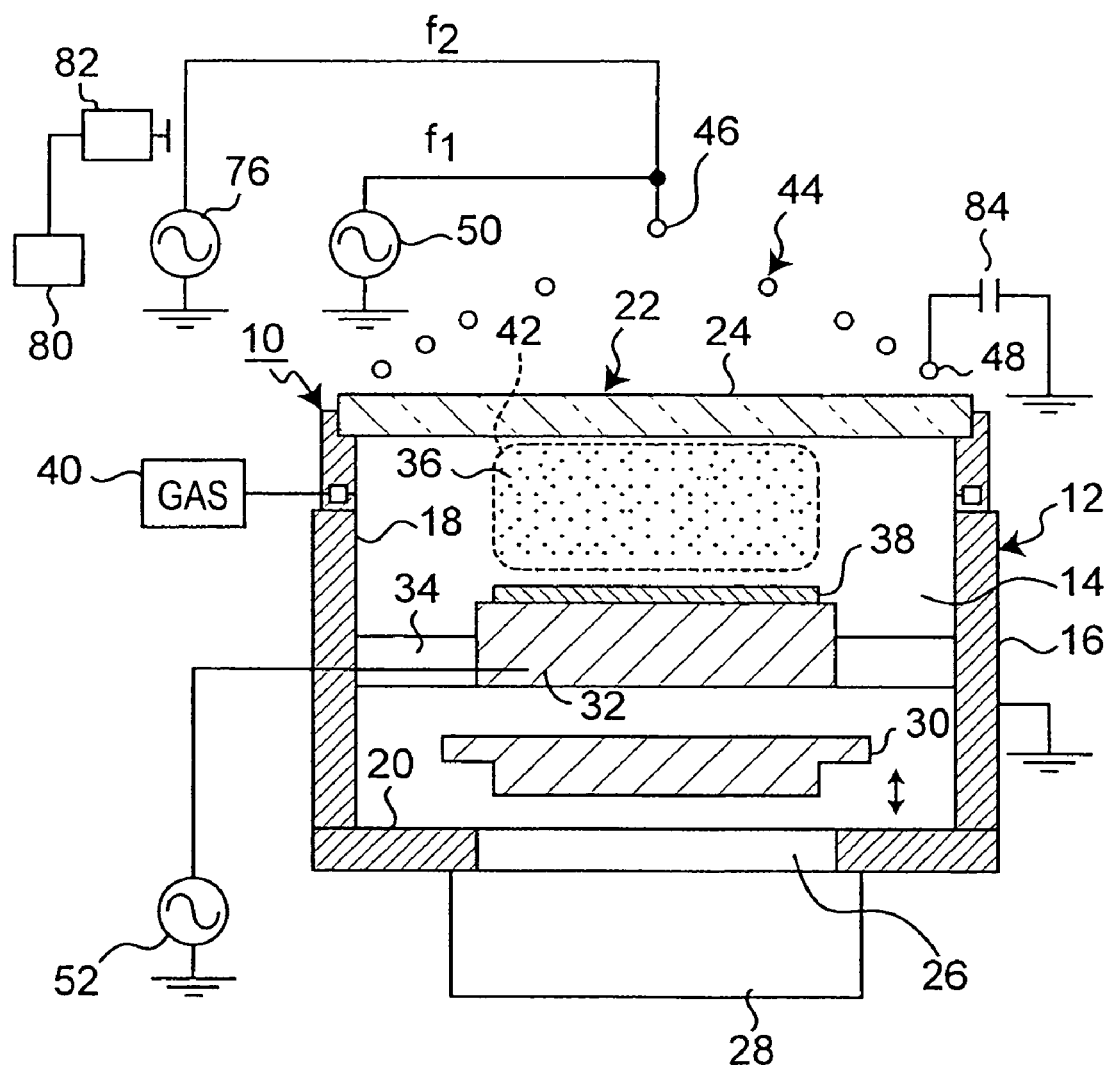
FIG. 5 is a schematic cross sectional view of another doping device of the present invention.

FIG. 5 shows another modification of the device. According to this modification, the central end portion of the antenna or coil 46 is also connected to another high frequency power supply 76 supplying a power of 500 kHz. The device further includes a reflected wave detection circuit 80 for detecting a reflected wave of 13.56 MHz from the coil 44 back to the power source 50. Also, the detection circuit 80 is connected to a band-pass filter 82 to prevent the circuit 80 from being adversely affected by the high frequency of 500 kHz from the power source 76. This ensures that the detection circuit 80 detects only a component having 13.56 MHz without any adverse affect which would be caused by any thickness variation of the sheath on the dielectric wall 24 due to the high frequency power of 500 Hz, allowing to detect any trouble which might have been caused in the high frequency power source 50 and/or in a matching circuit not shown. The peripheral end 48 of the coil 44 is connected through a capacitor 84 with a capacitance of about 1,000 picofarad, for example, to the ground.

Tests were conducted by the use of the device shown in FIG. 5. In the tests, after positioning the substrate on the table, a temperature of the table 32 was maintained at 10° C. The gas including Ar was supplied into the chamber at 10 sccm (standard cubic centimeters per minute). The pressure in the chamber was maintained at 0.04 Pa. Then, the spiral coil 44 was applied with 13.56 MHz high frequency power of 800 watts from the power source 50 and, simultaneously, with 500 kHz high frequency power of 400 watts from the power source 76. Also, another high frequency power was applied to the table 32 from the power source 52. As a result, it was confirmed that the boron was implanted in the surface of the substrate 38.

As described in connection with the embodiments shown in FIGS. 2 to 4, various changes and alternatives may be employed in terms of the coil, the top wall and the magnetic coils.

Although in the previous embodiment the high frequency powers of 13.56 MHz (f1) and 500 kHz (f2) were applied to the coil, it is preferably determined that the latter frequency f2 is about one tenth that of the former frequency f1. For example, in the previous embodiment in which 13.56 MHz and 500 kHz were applied to the coil, components of the impedance of the capacitor 84 with respect to the higher and lower high frequency f1 and f2 are calculated, respectively, as follows:

$$1/(2\pi \times 13.56 \times 10^6 \times 1000 \times 10^{-12}) = 12\Omega \quad (1)$$

$$1/(2\pi \times 500 \times 10^3 \times 1000 \times 10^{-12}) = 320\Omega \quad (2)$$

On the other hand, assuming the inductance of coil 44 is 0.8 μH, components of the impedance of the coil 44 with respect to f1 and f2 are calculated, respectively, as follows:

$$2\pi \times 13.56 \times 10^6 \times 0.8 \times 1000 \times 10^{-6} = 68\Omega \quad (3)$$

$$2\pi \times 500 \times 10^3 \times 0.8 \times 1000 \times 10^{-6} = 2.5\Omega \quad (4)$$

Then, ratios of voltages applied to the coil 44 and the capacitor 84 with respect to f1 and f2 are calculated, respectively, as follows:

$$68 \div 12 = 5.7 \quad (5)$$

$$2.5 \div 320 = 0.0078 \quad (6)$$

This result means that when viewed from f1, the series circuit including the coil and the capacitor acts as an inductance element and, on the other hand, when viewed from f2, it act as a capacitor element. Therefore, the inductively coupled plasma is generated by the high frequency f1 while the capacitive coupling between the coil 44 and the plasma causes an ion to impinge against the top wall 24 with an aid of the high frequency of f2. This means that the plasma density is controlled by the control of the high frequency power of f1 and that impinging of the ion is controlled by the control of the high frequency power of f2, independently, which is supposed to be attained only when the frequency f2 is about equal to or less than one tenth of the f1.

In addition, when the impedance of the coil 44 with respect to f1 is two times more than that of capacitor 84 or when the impedance of the coil with respect to f2 is less than one-fifth that of the capacitor, the difference between f1 and f2 is effectively reflected in the ratio of voltages applied to the coil 44 and the capacitor 84. It is understood that, when using a plurality of spiral coils arranged in one plane, the impedance is examined for each combination of coil and capacitor.

For example, it is understood that when the impedance of the capacitor with respect to f1 is less than 25Ω and the impedance of the capacitor with respect to f2 is equal to or more than 250Ω, an efficient difference is generated in voltages applied to the coil 44 and the capacitor 84. The same effect is attained if the impedance of the coil with respect to f1 is less than 5Ω and the impedance of the coil with respect to f2 is equal to or more than 50Ω.

Figure 6A:
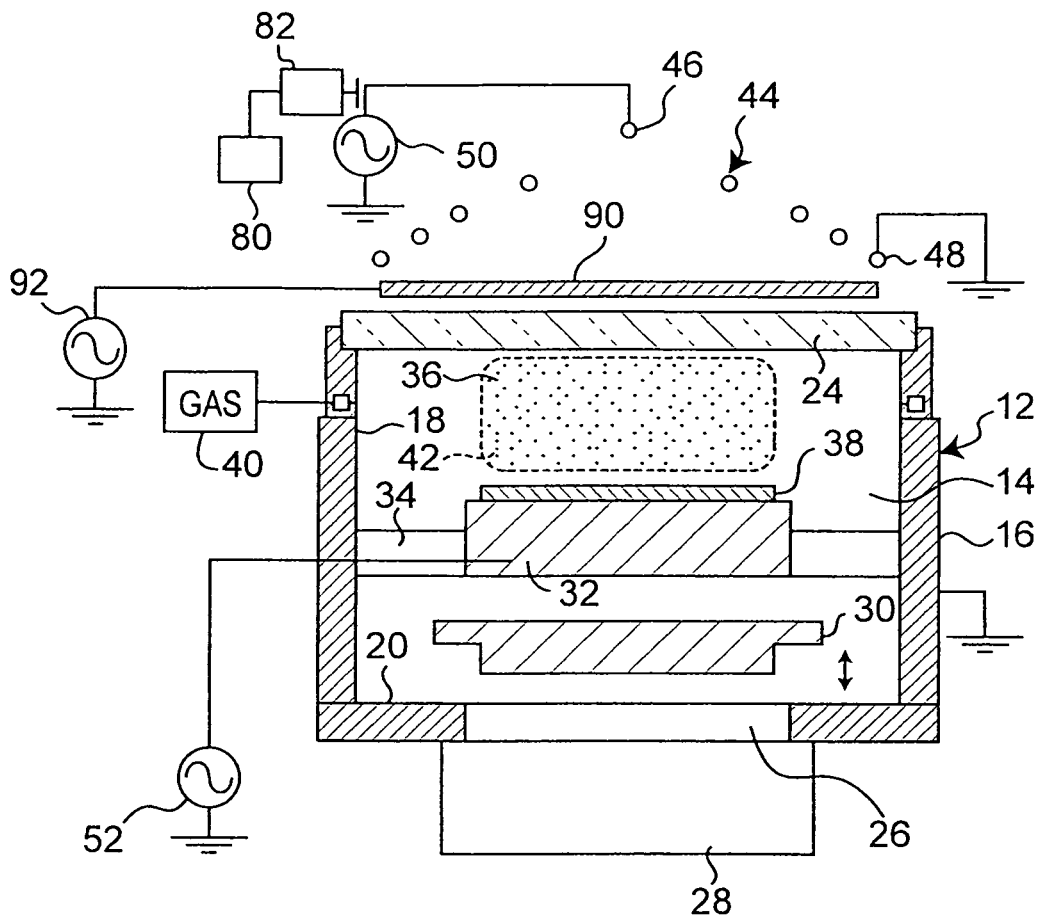
FIG. 6A is a schematic cross sectional view of another doping device of the present invention.
Figure 6B:
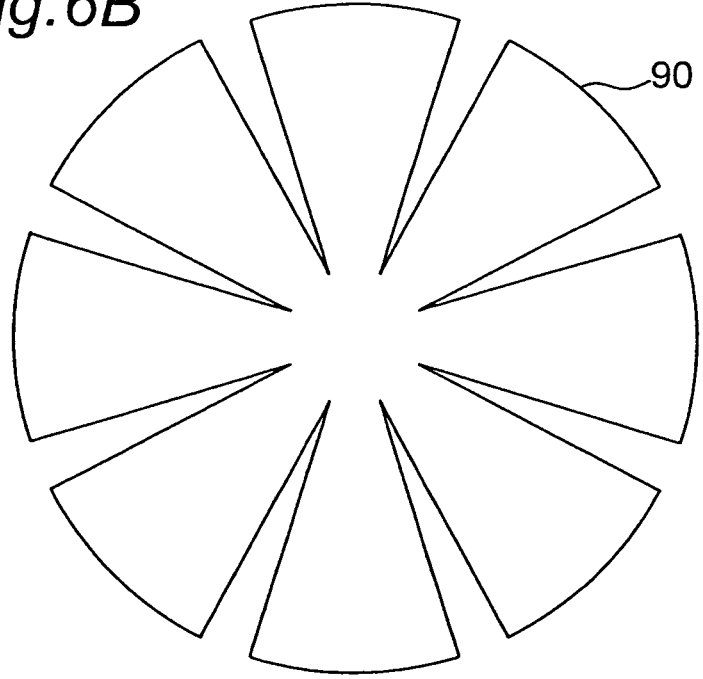
FIG. 6B is a plan view of an electrode used in the doping device shown in FIG. 6A.

FIG. 6A shows another embodiment of the doping device of the present invention. In this embodiment, a plate-like electrode 90 is provided on or above the top wall 24 and below the coil 44. As best shown in FIG. 6B, the electrode 90 is so designed that it has a plurality of branches each extending radially outwardly from and symmetrically with its center corresponding to the axis of the chamber 14. Also, the electrode 90 is connected to a high frequency power source 92 so that it supplies a high frequency power of 900 kHz to the electrode. With this arrangement, the amount of boron from the surface of or the interior of the top wall 24 is discharged into the chamber 14 in an even manner. Also, each of the branches of the electrode extends perpendicular to the spiral coil, which provides no adverse affect to the magnetic field generated by the coil.

Figure 7:
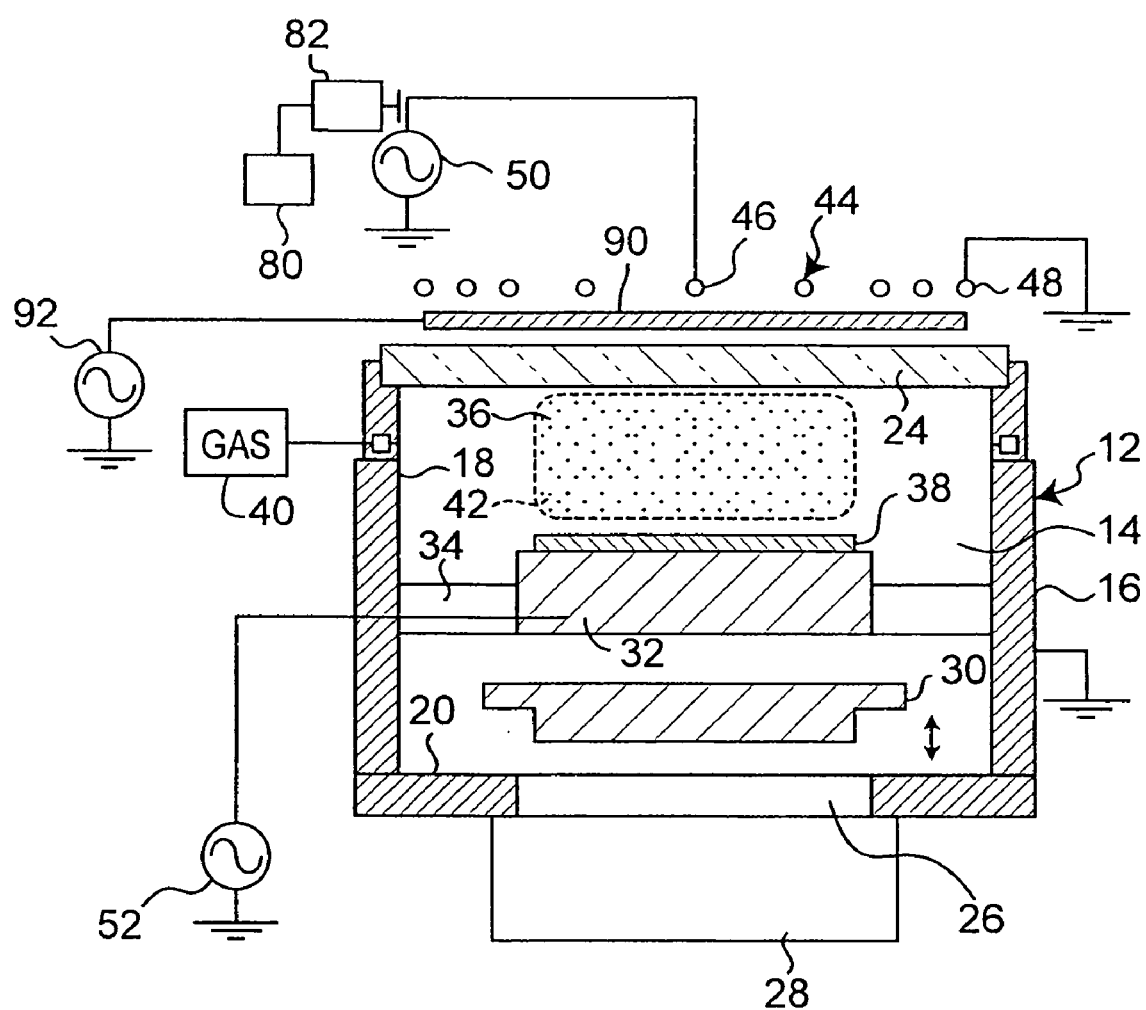
FIG. 7 is a schematic cross sectional view of another doping device of the present invention.

As shown in FIG. 7 the spiral coil 44 may be positioned in one plane parallel to the top wall rather than in the conical fashion.

Figure 8A:
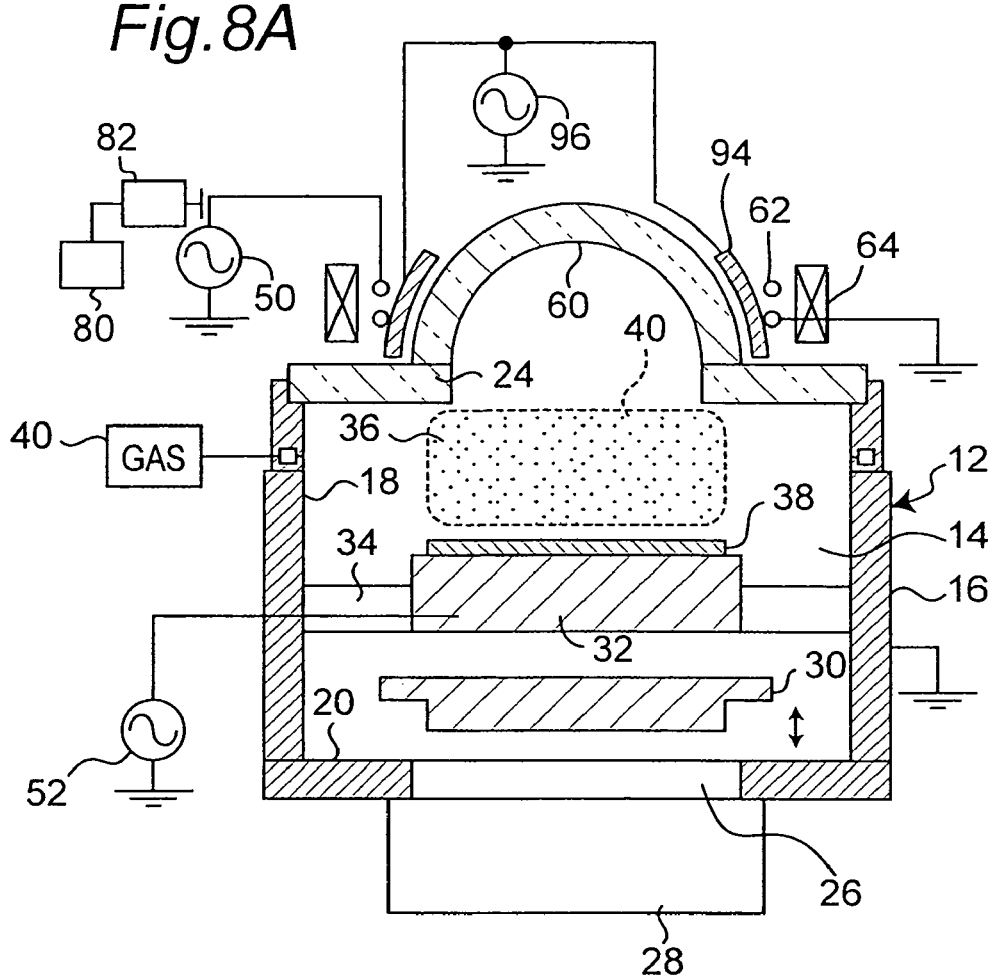
FIG. 8A is a schematic cross sectional view of another doping device of the present invention.
Figure 8B:
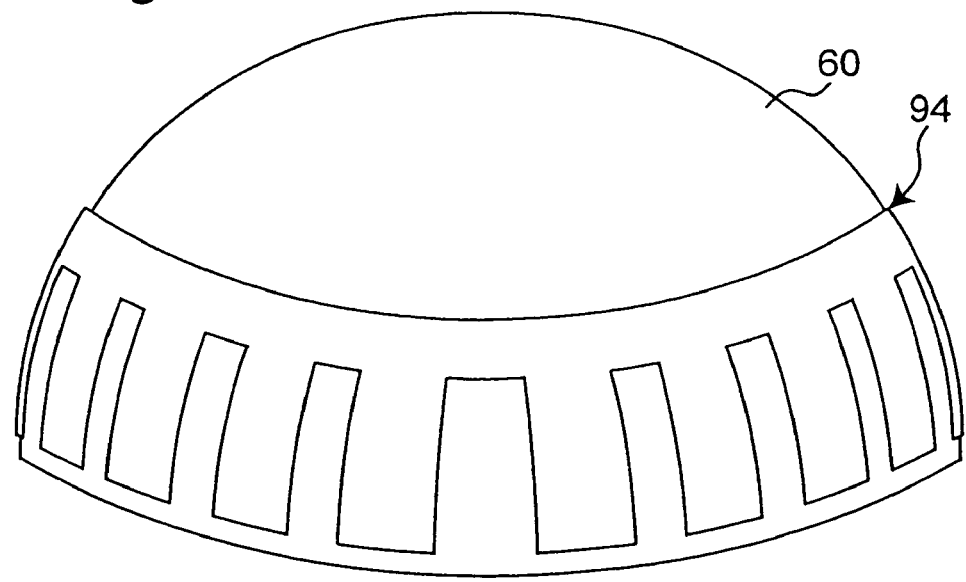
FIG. 8B is a schematic perspective sectional view of an electrode used in the doping device shown in FIG. 6A.
Figure 9:
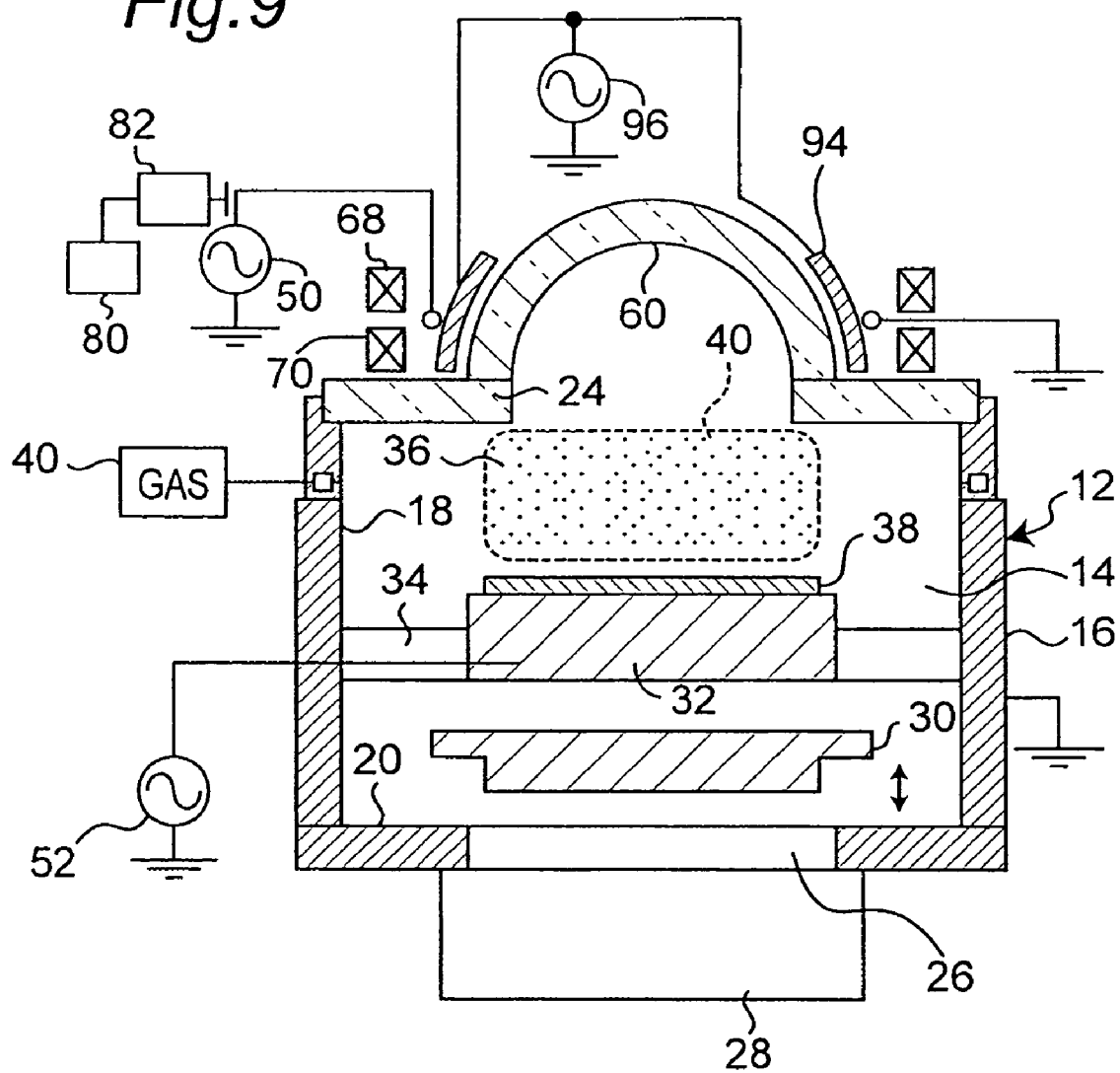
FIG. 9 is a schematic cross sectional of another doping device of the present invention.

Also, as shown in FIGS. 8A, 8B and 9, illustrating modifications of the devices described in connection with FIGS. 3 and 4, if the top wall 24 has the semidome portion 60, provided between the semidome 60 and the magnetic coil 64 is an electrode 94 or antenna connected to a high frequency power source 96. Preferably, the electrode 94 has an annular portion surrounding the semidome portion 60 and a plurality of branches 98 each extending radially outwardly from the annular portion and along the outer surface of the semidome portion 60.

Figure 10:
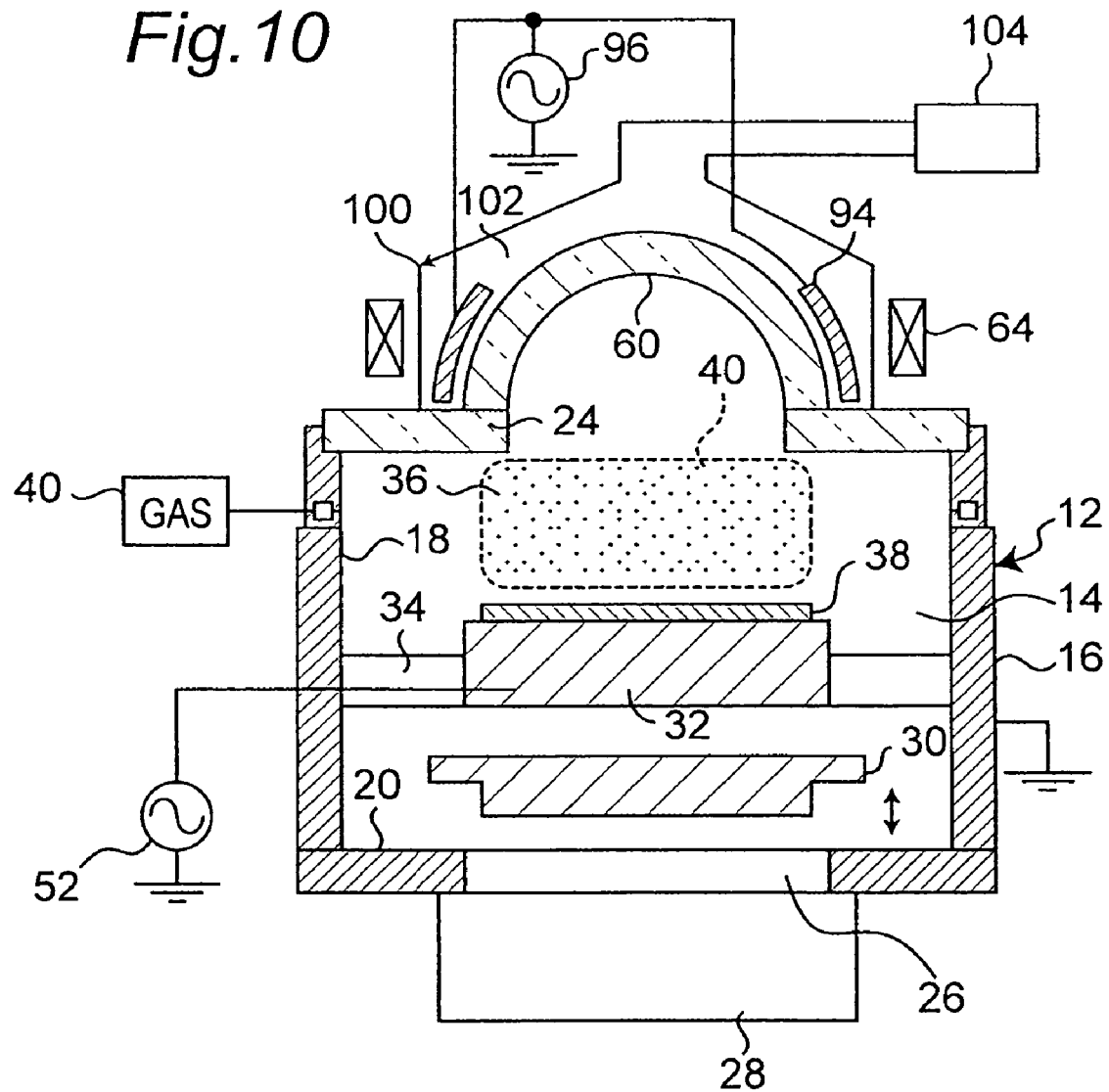
FIG. 10 is a schematic cross sectional of another doping device of the present invention.
Figure 11:
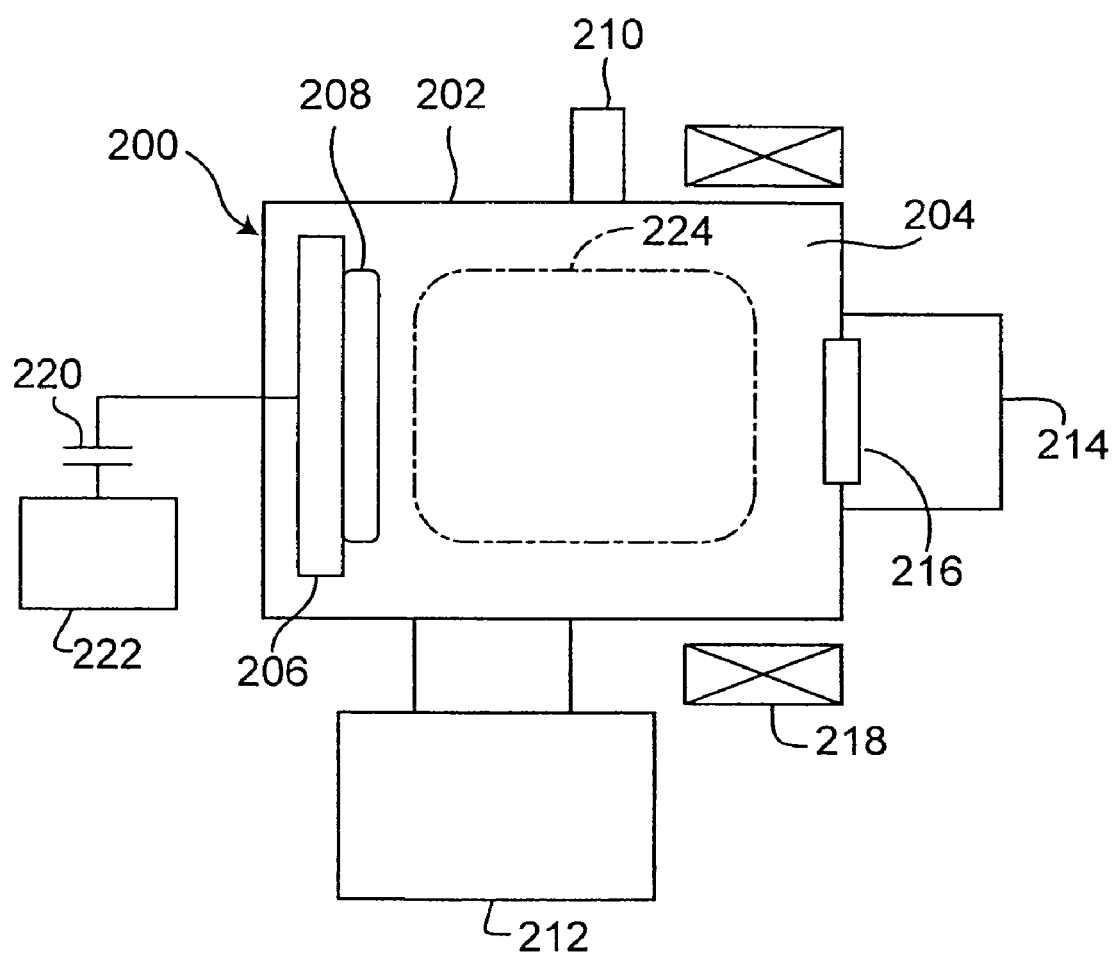
FIG. 11 is a schematic cross sectional of a conventional doping device.
Figure 12:
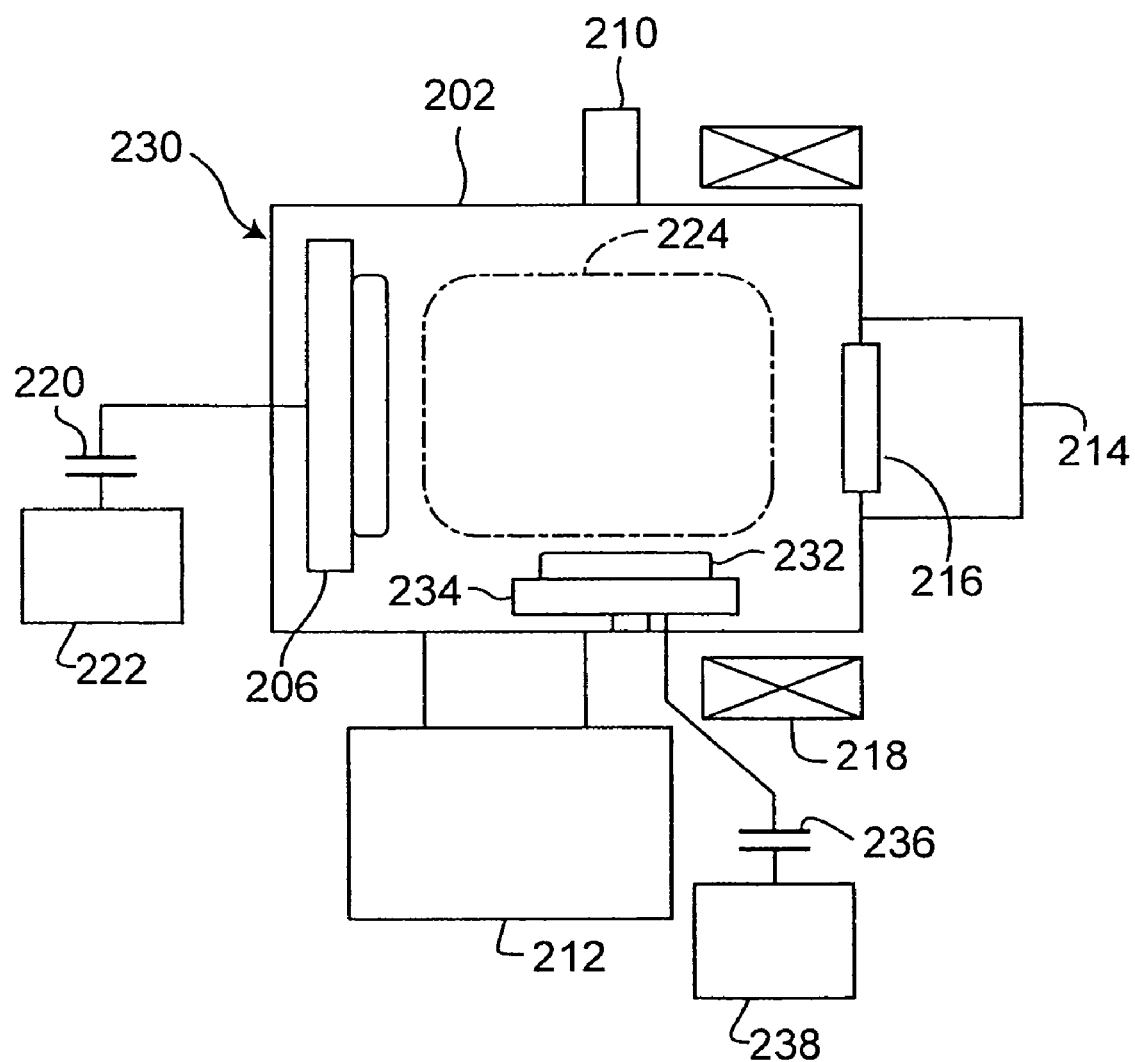
FIG. 12 is a schematic cross sectional of another conventional doping device.

Further, as shown in FIG. 10, an enclosure 100 may be provided so that it covers the semidome portion 60 and the electrode 94 to define a cavity 102 therearound. The cavity 102 is connected to a magnetron 104 for generating a microwave. According to this device, the micro wave from the magnetron 104 is transmitted through the cavity 102 to the electrode 94, causing a cyclotron resonance plasma in the chamber 14 having a higher density than the induced coupling plasma.

Although various embodiments have been described so far, the implantation device of the present invention may be modified and/or improved in various manners.

Also, although the semiconductor plate made of silicon is used for the substrate, it may be made of any material.

Further, although boron is used for the implantation impurity, i.e., dopant, another impurity including arsenic, phosphorus, aluminum, and antimony may be implanted instead or additionally.

Further, although argon Ar is used for the dilution gas, it may be replaced with another gas made of nitrogen and helium, for example.

What is claimed is:

1. A plasma doping method, comprising the steps of:
  supplying a gas into a vacuum container while discharging an interior gas of the vacuum container, the vacuum container having a portion made of a dielectric material and fixedly bearing boron and/or phosphorus; and controlling a pressure of an interior of the vacuum container at a certain pressure while supplying a high frequency electric power with a first frequency to a coil or an antenna disposed adjacent the dielectric material portion of the vacuum container, generating a plasma within the vacuum container, impinging ion in the plasma on the dielectric material portion to emit the boron and/or phosphorus therefrom, and implanting the emitted boron and/or phosphorus into a substrate placed on an electrode disposed within the vacuum container.

2. The plasma doping method according to claim 1, wherein the first frequency is approximately 13.56 MHz.

3. A plasma doping method, comprising the steps of:
supplying a gas into a vacuum container while discharging an interior gas of the vacuum container, the vacuum container having a portion made of a dielectric material and fixedly bearing boron and/or phosphorus provided on an inner surface thereof; and
controlling a pressure of an interior of the vacuum container at a certain pressure while supplying a high frequency electric power with a first frequency to a coil or an antenna disposed adjacent the dielectric material portion of the vacuum container, generating a plasma within the vacuum container, impinging ion in the plasma on the dielectric material portion to emit the boron and/or phosphorus therefrom, and implanting the emitted boron and/or phosphorus into a substrate placed on an electrode disposed within the vacuum container.

4. The plasma doping method according to claim 3, wherein the first frequency is approximately 13.56 MHz.

5. A plasma doping method, comprising the steps of:
supplying a gas into a vacuum container while discharging an interior gas of the vacuum container, the vacuum container having a portion made of a dielectric material and fixedly bearing boron and/or phosphorus; and
controlling a pressure of an interior of the vacuum container at a certain pressure while supplying a high frequency electric power with a first frequency to a coil or an antenna disposed adjacent the dielectric material portion of the vacuum container to generate a plasma within the vacuum container and also supplying a high frequency electric power with a second frequency to an electrode disposed between the coil or the antenna and the dielectric material portion, thereby impinging ion in the plasma on the dielectric material portion to emit the boron and/or phosphorus therefrom, and implanting the emitted boron and/or phosphorus into a substrate placed on an electrode disposed within the vacuum container.

6. The plasma doping method according to claim 5, wherein the first frequency is approximately 13.56 MHz.

7. The plasma doping method according to claim 6, wherein the second frequency is approximately 900 kHz.

8. A plasma doping method, comprising the steps of:
supplying a gas into a vacuum container while discharging an interior gas of the vacuum container, the vacuum container having a portion made of a dielectric material and fixedly bearing boron and/or phosphorus provided on an inner surface thereof; and
controlling a pressure of an interior of the vacuum container at a certain pressure while supplying a high frequency electric power with a first frequency to a coil or an antenna disposed adjacent the dielectric material portion of the vacuum container to generate a plasma within the vacuum container and also supplying a high frequency electric power with a second frequency to an electrode disposed between the coil or the antenna and the dielectric material portion, thereby impinging ion in the plasma on the dielectric material portion to emit the boron and/or phosphorus therefrom, and implanting the emitted boron and/or phosphorus into a substrate placed on an electrode disposed within the vacuum container.

9. The plasma doping method according to claim 8, wherein the first frequency is approximately 13.56 MHz.

10. The plasma doping method according to claim 9, wherein the second frequency is approximately 900 kHz.

* * * * *